(12) United States Patent
Chen et al.

(10) Patent No.: US 8,722,180 B2
(45) Date of Patent: May 13, 2014

(54) COATED ARTICLE AND METHOD FOR MAKING SAID ARTICLE

(75) Inventors: Wen-Rong Chen, New Taipei (TW); Huann-Wu Chiang, New Taipei (TW); Cheng-Shi Chen, New Taipei (TW); Cong Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 306 days.

(21) Appl. No.: 13/247,038

(22) Filed: Sep. 28, 2011

(65) Prior Publication Data
US 2013/0029119 A1    Jan. 31, 2013

(30) Foreign Application Priority Data
Jul. 27, 2011    (CN) .......................... 2011 1 0211737

(51) Int. Cl.
*B32B 7/04* (2006.01)
*B32B 27/06* (2006.01)
*G11B 11/05* (2006.01)
*B32B 15/00* (2006.01)

(52) U.S. Cl.
USPC ........... 428/213; 428/457; 428/332; 428/432; 427/419.7; 204/192.15

(58) Field of Classification Search
None
See application file for complete search history.

(56) References Cited

FOREIGN PATENT DOCUMENTS

| JP | 2010-137305 | * | 6/2010 |
| JP | 2012-166294 | * | 9/2012 |

* cited by examiner

*Primary Examiner* — David Sample
*Assistant Examiner* — Nicole T Gugliotta
(74) *Attorney, Agent, or Firm* — Novak Druce Connolly Bove + Quigg LLP

(57) ABSTRACT

A coated article includes a substrate, and a plurality of molybdenum layers and a plurality of titanium-aluminum-nitrogen layers formed on the substrate. Each molybdenum layer interleaves with one titanium-aluminum-nitrogen layer. One of the molybdenum layers is directly formed on the substrate. A method for making the coated article is also described.

15 Claims, 2 Drawing Sheets

(1)

COATED ARTICLE AND METHOD FOR MAKING SAID ARTICLE

BACKGROUND

1. Technical Field

The present disclosure relates to coated articles and a method for making the coated articles.

2. Description of Related Art

Nitrides, carbides and carbonitrides of transition metals are usually coated on cutting tools or molds due to their high hardness, high wear resistance and good chemical stability. However, the layers coated on cutting tools or molds are also required to have good corrosion resistance and high-temperature resistance.

Therefore, there is room for improvement within the art.

BRIEF DESCRIPTION OF THE FIGURE

Many aspects of the coated article and the method for making the coated article can be better understood with reference to the following drawings. The components in the drawings are not necessarily drawn to scale, the emphasis instead being placed upon clearly illustrating the principles of the coated article and the method. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
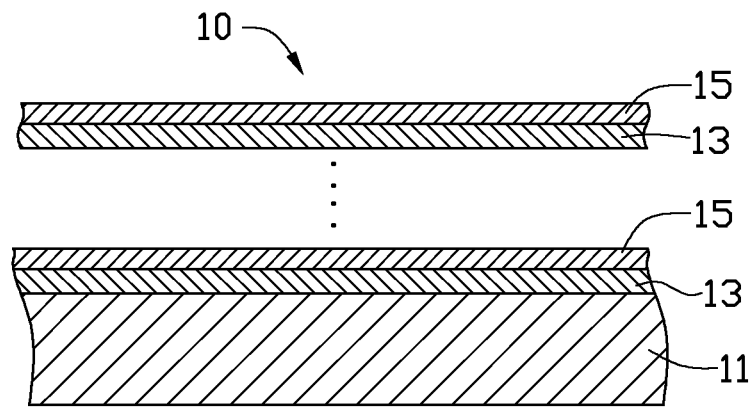
FIG. 1 is a cross-sectional view of an exemplary coated article.

FIG. 1 shows a coated article 10 according to an exemplary embodiment. The coated article 10 includes a substrate 11, and a plurality of molybdenum (Mo) layers 13 and a plurality of titanium-aluminum-nitrogen (Ti—Al—N) layers 15 formed on the substrate 11. Each Mo layer 13 alternates/interleaves with one Ti—Al—N layer 15. One of the Mo layers 13 is directly formed on the substrate 11. Furthermore, one of the Ti—Al—N layers 15 forms the outermost layer of the coated article 10. The total thickness of the Mo layers 13 and the Ti—Al—N layers 15 may be about 1.2 μm to about 2.4 μm. The total number of the Mo layers 13 may be about 40 layers to about 60 layers. The total number of the Ti—Al—N layers 15 is the same as the total number of Mo layers.

The substrate 11 is made of metal, glass or ceramic.

A vacuum sputtering process may be used to form the Mo layers 13 and the Ti—Al—N layers 15. Each Mo layer 13 may have a thickness of about 15 nm to about 20 nm. Each Ti—Al—N layer 15 may have a thickness of about 15 nm to about 20 nm. Each Ti—Al—N layer 15 contains by atomic percentage, about 75% to about 82% of titanium, about 15% to about 17% of aluminum and about 1% to about 10% of nitrogen.

Figure 2:
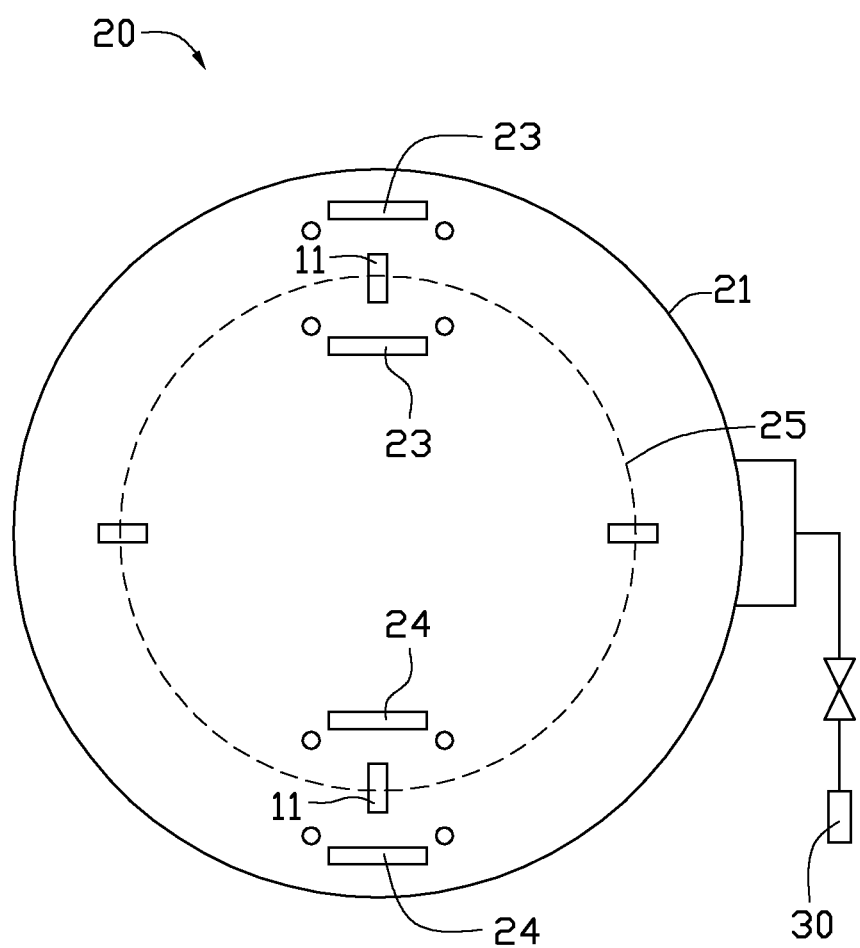
FIG. 2 is a schematic view of a vacuum sputtering device for fabricating the coated article in FIG. 1.

FIG. 2 shows a vacuum sputtering device 20, which includes a vacuum chamber 21 and a vacuum pump 30 connected to the vacuum chamber 21. The vacuum pump 30 evacuates the vacuum chamber 21. The vacuum chamber 21 has molybdenum targets 23, titanium-aluminum alloy targets 24 and a rotary rack (not shown) positioned therein. The rotary rack holding the substrate 11 revolves along a circular path 25, and the substrate 11 is also rotated about its own axis while being carried by the rotary rack.

A method for making the coated article 10 may include the following steps:

The substrate 11 is pretreated. The pre-treating process may include wiping the surface of the substrate 11 with alcohol and deionized water, to remove impurities such as grease or dirt from the substrate 11. Then, the substrate 11 is dried.

One of the Mo layers 13 may be vacuum sputtered on the substrate 11. Vacuum sputtering of the Mo layers 13 is carried out in the vacuum chamber 21. The substrate 11 is positioned in the rotary rack. The vacuum chamber 21 is evacuated to about $8.0\times10^{-3}$ Pa and is heated to a temperature of about 60° C. to about 200° C. Ar is used as the sputtering gas and is fed into the vacuum chamber 21 at a flow rate of about 400 sccm to about 800 sccm. The molybdenum targets 23 are supplied with electrical power of about 10 kw to about 15 kw. A negative bias voltage of about −150 V to about −500 V is applied to the substrate 11. Deposition of the Mo layer 13 takes about 0.5 min to about 1.0 min.

One of the Ti—Al—N layers 15 is vacuum sputtered on the Mo layer 13. Vacuum sputtering of the Ti—Al—N layers 15 is carried out in the vacuum chamber 21. Molybdenum targets 23 are powered off and titanium-aluminum alloy targets 24 are supplied with electrical power of about 8 kw to about 12 kw. Nitrogen is used as the reaction gas and is fed into the vacuum chamber 21 at a flow rate of about 100 sccm to about 200 sccm. The flow rate of Ar, temperature of the vacuum chamber 21 and the negative bias voltage are the same as vacuum sputtering of the Mo layer 13. Deposition of the Ti—Al—N layer 15 takes about 0.5 min to about 1.0 min The steps of magnetron sputtering the Mo layer 13 and the Ti—Al—N layers 15 are alternatingly repeated about 40-60 times to form the coated article 10.

Example 1

The substrate 11 was made of die steel.

Sputtering to form the Mo layer 13 on the substrate 11 took place, wherein the vacuum chamber 21 was heated to a temperature of about 82° C. Ar was fed into the vacuum chamber 21 at a flow rate of about 400 sccm. The molybdenum targets 23 were supplied with a power of about 10 kw, and a negative bias voltage of about −200 V was applied to the substrate 11. Deposition of the Mo layer 13 took about 0.5 min The Mo layer 13 had a thickness of about 15 nm.

Sputtering to form the Ti—Al—N layers 15 on the Mo layer 13 took place, wherein $N_2$ was fed into the vacuum chamber 21 at a flow rate of about 130 sccm. The titanium-aluminum alloy targets 24 were supplied with a power of about 10 kw. Other conditions were substantially the same as vacuum sputtering of the Mo layer 13. The deposition of the Ti—Al—N layers 15 took about 0.5 min The Ti—Al—N layers 15 had a thickness of about 15 nm.

The step of sputtering the Mo layer 13 was repeated 55 times, and the step of sputtering the Ti—Al—N layers 15 was repeated 55 times.

Example 2

The substrate 11 was made of die steel.

Sputtering to form the Mo layer 13 on the substrate 11 took place, wherein the vacuum chamber 21 was heated to a temperature of about 82° C. Ar was fed into the vacuum chamber 21 at a flow rate of about 500 sccm. The molybdenum targets 23 were supplied with a power of about 10 kw, and a negative bias voltage of about −200 V was applied to the substrate 11. Deposition of the Mo layer 13 took about 1.0 min The Mo layer 13 had a thickness of about 20 nm.

Sputtering to form the Ti—Al—N layers 15 on the Mo layer 13 took place, wherein N₂ was fed into the vacuum chamber 21 at a flow rate of about 150 sccm. The titanium-aluminum alloy targets 24 were supplied with a power of about 10 kw. Other conditions were substantially the same as vacuum sputtering of the Mo layer 13. The deposition of the Ti—Al—N layers 15 took about 1.0 min The Ti—Al—N layers 15 had a thickness of about 20 nm.

The step of sputtering the Mo layer 13 was repeated 55 times, and the step of sputtering the Ti—Al—N layers 15 was repeated 55 times.

The coated article 10 includes a plurality of alternating molybdenum layers 13 and titanium-aluminum-nitrogen layers 15 formed on the substrate, which produces strong interface effect and interlayer coupling, and make the coated article 10 has special properties different from single-layer coatings. The alternating molybdenum layers 13 and titanium-aluminum-nitrogen layers 15 has small grains and the layers are very dense, which improves the corrosion resistance of the coated article 10. Furthermore, the molybdenum layers 13 have good high-temperature resistance, which improves the high-temperature resistance of the coated article 10.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
   a substrate; and
   a plurality of alternating molybdenum layers and titanium-aluminum-nitrogen layers formed on the substrate, one of the molybdenum layers being directly formed on the substrate, one of the titanium-aluminum-nitrogen layers forming an outermost layer of the coated article, each titanium-aluminum-nitrogen layer comprising about 75% to about 82% of titanium, about 15% to about 17% of aluminum, and about 1% to about 10% of nitrogen by atomic percentage.

2. The coated article as claimed in claim 1, wherein the molybdenum layers and the titanium-aluminum-nitrogen layers have a total thickness of about 1.2 μm to about 2.4 μm.

3. The coated article as claimed in claim 1, wherein each molybdenum layer has a thickness of about 15 nm to about 20 nm.

4. The coated article as claimed in claim 1, wherein each titanium-aluminum-nitrogen layer has a thickness of about 15 nm to about 20 nm.

5. The coated article as claimed in claim 1, wherein the substrate is made of metal, glass or ceramic.

6. The coated article as claimed in claim 1, wherein total number of the molybdenum layers is about 40 layers to about 60 layers, and the total number of the titanium-aluminum-nitrogen layers equals the number of molybdenum layers.

7. A method for making a coated article, comprising:
   providing a substrate;
   forming a molybdenum layer on the substrate;
   forming a titanium-aluminum-nitrogen layer on the molybdenum layer, the titanium-aluminum-nitrogen layer comprising about 75% to about 82% of titanium, about 15% to about 17% of aluminum, and about 1% to about 10% of nitrogen by atomic percentage; and
   repeating the steps of alternatingly forming the molybdenum layer and the titanium-aluminum-nitrogen layer to form the coated article.

8. The method as claimed in claim 7, wherein magnetron sputtering the molybdenum layer uses argon gas as the sputtering gas and the argon gas has a flow rate of about 400 sccm to about 800 sccm; magnetron sputtering the molybdenum layer is carried out at a temperature of about 60° C. to about 200° C.; uses molybdenum targets and the molybdenum targets are supplied with a power of about 10 kw to about 15 kw; a negative bias voltage of about −150 V to about −500 V is applied to the substrate.

9. The method as claimed in claim 8, wherein vacuum sputtering the molybdenum layer takes about 0.5 min to about 1.0 min.

10. The method as claimed in claim 7, wherein magnetron sputtering the titanium-aluminum-nitrogen layer uses argon gas as the sputtering gas and the argon gas has a flow rate of about 400 sccm to about 800 sccm; uses nitrogen as the reaction gas and the nitrogen has a flow rate of about 100 sccm to about 200 sccm; magnetron sputtering the titanium-aluminum-nitrogen layer is carried out at a temperature of about 60° C. to about 200° C.; uses titanium-aluminum alloy targets and the titanium-aluminum alloy targets are supplied with a power of about 8 kw to about 12 kw; a negative bias voltage of about −150 V to about −500 V is applied to the substrate.

11. The method as claimed in claim 10, wherein vacuum sputtering the titanium-aluminum-nitrogen layer takes about 0.5 min to about 1.0 min.

12. The method as claimed in claim 7, wherein the substrate is made of metal, glass or ceramic.

13. The method as claimed in claim 7, wherein each molybdenum layer has a thickness of about 15 nm to about 20 nm.

14. The method as claimed in claim 7, wherein each titanium-aluminum-nitrogen layer has a thickness of about 15 nm to about 20 nm.

15. The method as claimed in claim 7, wherein the step of repeating the forming of the molybdenum layer and the titanium-aluminum-nitrogen layer is each carried out an equal number times ranging from about forty times to about sixty times.

* * * * *